(12) United States Patent
Yang

(10) Patent No.: US 9,686,881 B2
(45) Date of Patent: Jun. 20, 2017

(54) SERVER

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Meng-Liang Yang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 190 days.

(21) Appl. No.: 14/735,884

(22) Filed: Jun. 10, 2015

(65) Prior Publication Data

US 2016/0338210 A1 Nov. 17, 2016

(30) Foreign Application Priority Data

May 12, 2015 (CN) .......................... 2015 1 0238049

(51) Int. Cl.
H05K 7/14 (2006.01)
H05K 5/02 (2006.01)
G06F 1/24 (2006.01)

(52) U.S. Cl.
CPC ......... *H05K 7/1487* (2013.01); *H05K 5/0208* (2013.01)

(58) Field of Classification Search
CPC .................................................. H05K 7/1487
See application file for complete search history.

(56) References Cited

U.S. PATENT DOCUMENTS

| 5,303,171 A | * | 4/1994 | Belt | G06F 1/24 |
| | | | | 713/321 |
| 5,530,620 A | * | 6/1996 | Sangveraphunsiri | G06F 13/4063 |
| | | | | 361/679.33 |
| 5,760,690 A | * | 6/1998 | French | G08B 13/1436 |
| | | | | 340/571 |
| 5,912,621 A | * | 6/1999 | Schmidt | G06F 21/86 |
| | | | | 340/568.1 |
| 2004/0150958 A1 | * | 8/2004 | Calhoon | H05K 5/0208 |
| | | | | 361/725 |

(Continued)

OTHER PUBLICATIONS

STIC Search Report; Jan. 27, 2017.*

*Primary Examiner* — Jared Fureman
*Assistant Examiner* — James Evans
(74) *Attorney, Agent, or Firm* — Steven Reiss

(57) ABSTRACT

A server includes a chassis having a base and a cover, a switch mounted on the chassis, and a motherboard. The motherboard includes a control circuit and a power-on pin. The control circuit includes a switch unit, and the switch unit includes a first buffer, a switch chip and a jumper. When the cover is detached from the base, the switch outputs a first signal to the first buffer, and the first buffer outputs the first signal to the switch chip. The switch chip outputs the first signal to the power-on pin, and the server is powered off. When the base is covered by the cover, the switch outputs a third signal to the first buffer and the first buffer outputs the third signal to the switch chip. The switch chip outputs the third signal to the power-on pin, and the server is powered on.

10 Claims, 4 Drawing Sheets

(56) References Cited

U.S. PATENT DOCUMENTS

| | | | |
|---|---|---|---|
| 2005/0081074 A1* | 4/2005 | Chheda | G06F 1/3203 |
| | | | 713/320 |
| 2010/0220506 A1* | 9/2010 | Tai | H02M 1/36 |
| | | | 363/49 |
| 2012/0243160 A1* | 9/2012 | Nguyen | G06F 1/181 |
| | | | 361/679.08 |
| 2013/0278060 A1* | 10/2013 | Tong | H02J 1/00 |
| | | | 307/31 |
| 2016/0324024 A1* | 11/2016 | Barron | G06F 1/188 |

* cited by examiner

SERVER

FIELD

The subject matter herein generally relates to a server.

BACKGROUND

In a server system, when a motherboard of a server needs to be repaired, a side of an enclosure of the server is detached to gain access to the motherboard. However, if the user forgets to power off the server when repairing the motherboard, he/she may be electrocuted or short-circuits to circuitries on the motherboard may occur.

BRIEF DESCRIPTION OF THE DRAWINGS

Implementations of the present technology will now be described, by way of example only, with reference to the attached figures.

DETAILED DESCRIPTION

Figure 1:
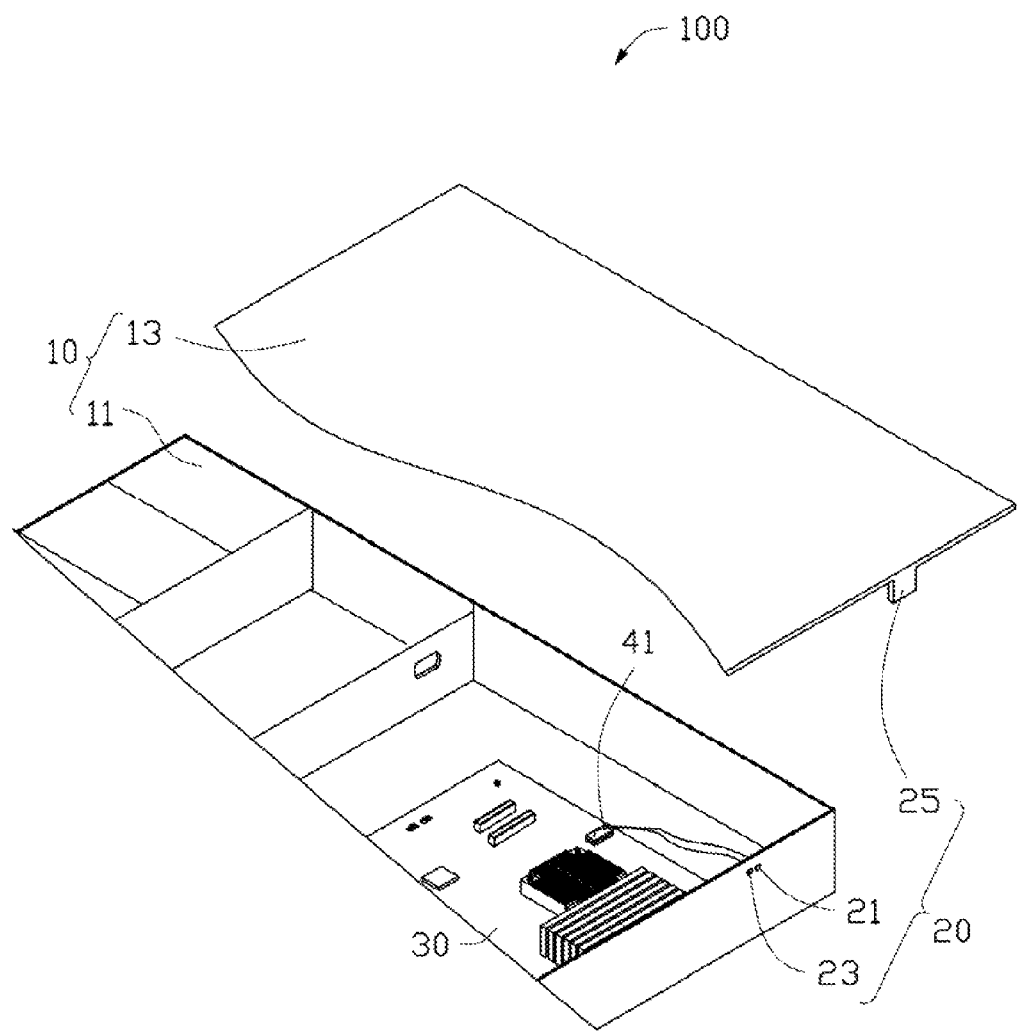
FIG. 1 is a partly exploded, isometric view of an exemplary embodiment of a server, the server comprising a switch and a motherboard.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure relates to a server.

Figure 2:
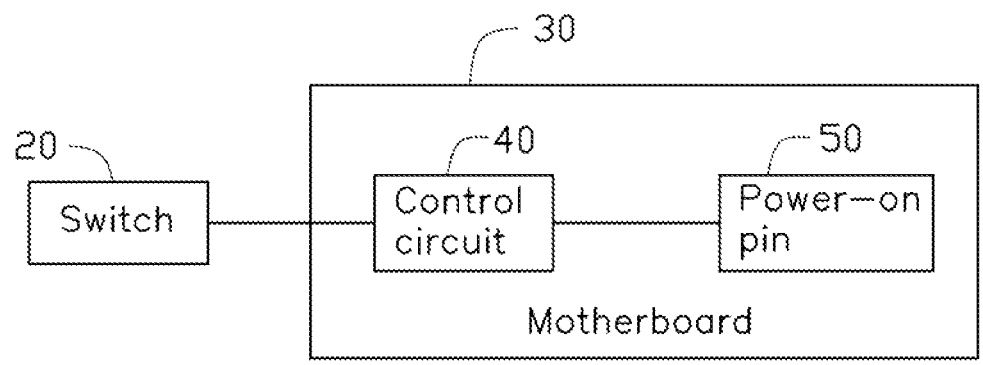
FIG. 2 is a block diagram of the switch and the motherboard of FIG. 1, the motherboard comprising a control circuit.

FIG. 1 and FIG. 2 illustrate an exemplary embodiment of a server 100. The server 100 can comprise a chassis 10, a switch 20 and a motherboard 30. The chassis 10 can comprise a base 11 and a cover 13 configured to cover the base 11. The motherboard 30 is mounted in the base 11. The switch 20 can comprise a first terminal 21, a second terminal 23 and a third terminal 25. The first terminal 21 and the second terminal 23 of the switch 20 are mounted on a side wall of the base 11, and both electrically couple to the motherboard 30. The third terminal 25 of the switch 20 is mounted on the cover 13. The motherboard 30 can comprise a control circuit 40 and a power-on pin 50. The control circuit 40 is electrically coupled to the switch 20 and the power-on pin 50.

Figure 3:
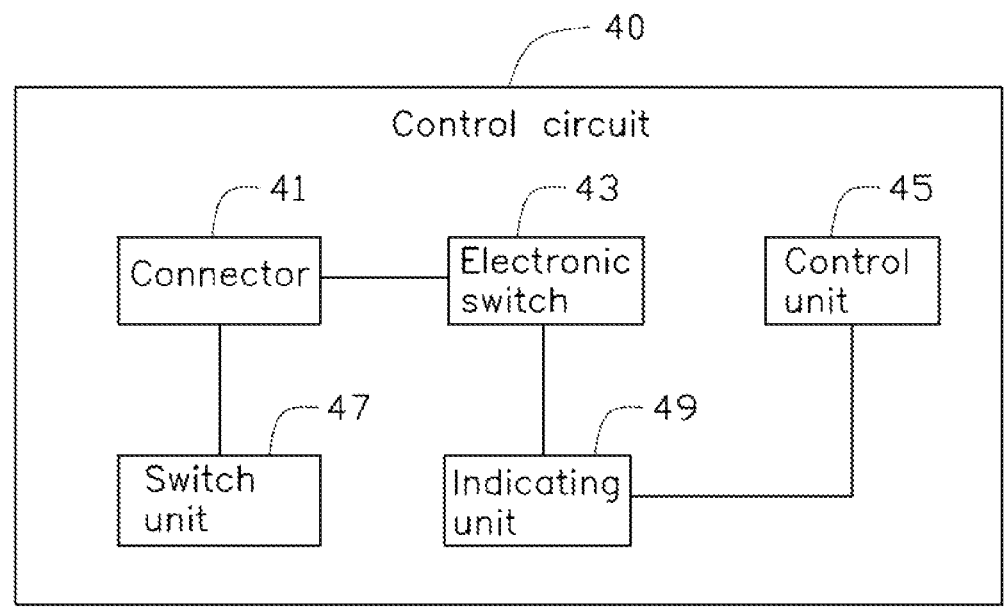
FIG. 3 is a block diagram of the control circuit of FIG. 2.

FIG. 3 illustrates an embodiment of the control circuit 40. The control circuit 40 can comprise a connector 41, an electronic switch 43, a control unit 45, a switch unit 47 and an indicating unit 49.

Figure 4:
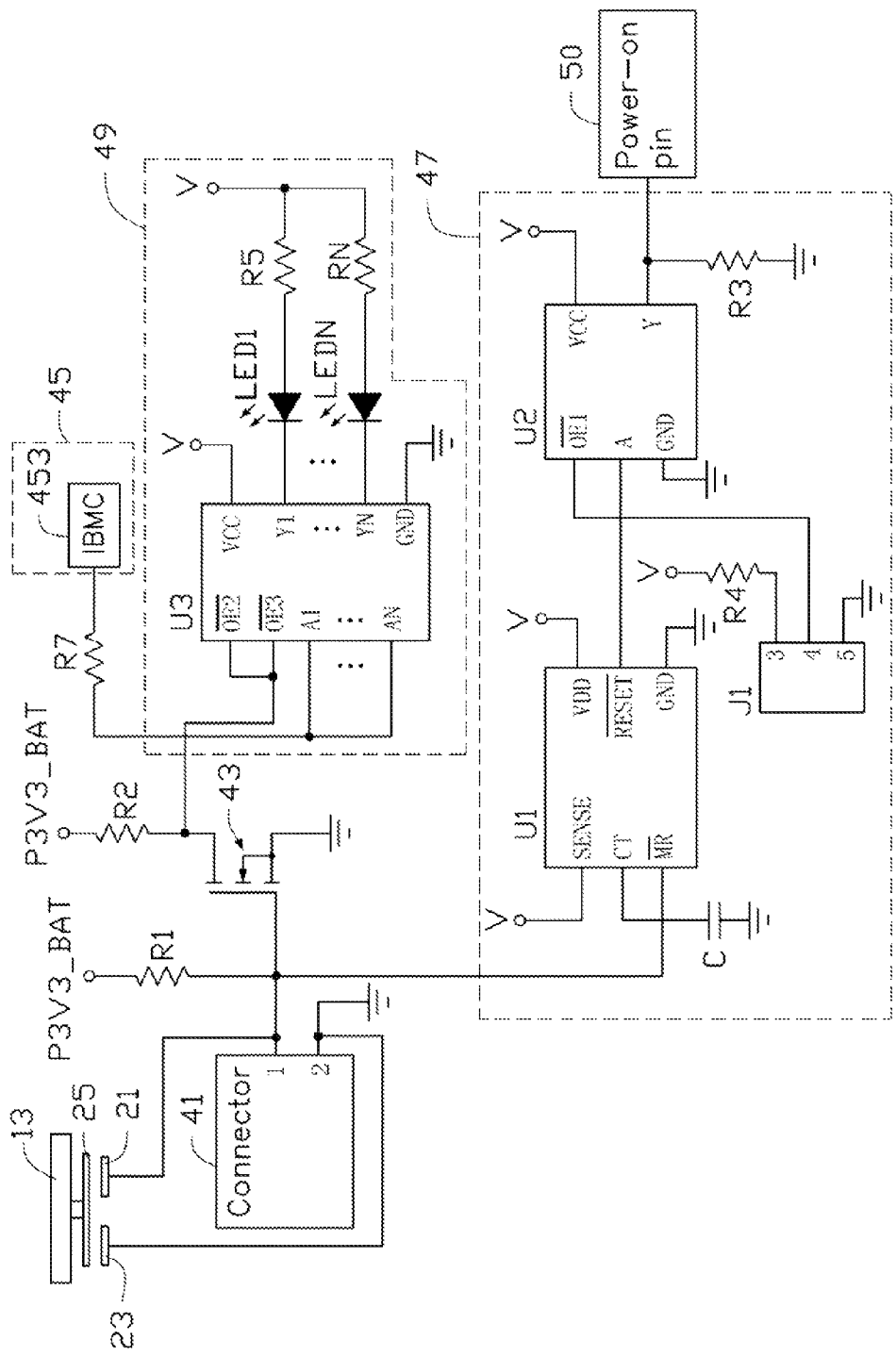
FIG. 4 is a circuit diagram of an embodiment of the server.

FIG. 4 illustrates a circuit diagram of the server 100. The connector 41 can comprise a pin 1 and a pin 2. The pin 1 of the connector 41 is electrically coupled to the electronic switch 43 and the switch unit 47 is electrically coupled to a power supply P3V3_BAT through a resistor R1, and electrically coupled to the first terminal 21 of the switch 20. The pin 2 of the connector 41 is electrically coupled to a ground, and electrically coupled to the second terminal 23 of the switch 20.

The electronic switch 43 can comprise a first terminal, a second terminal, and a third terminal. The first terminal of the electronic switch 43 is electrically coupled to the pin 1 of the connector 41, the second terminal of the electronic switch 43 is electrically coupled to the indicating unit 49 and electrically coupled to the power supply P3V3_BAT through a resistor R2, and the third terminal of the electronic switch 43 is electrically coupled to the ground. In at least one embodiment, the electronic switch 43 can be an n-channel metal-oxide semiconductor field-effect transistor (NMOSFET), and the first terminal, the second terminal, and the third terminal of the electronic switch 43 correspond to a gate, a drain, and a source of the NMOSFET. In other embodiments, the electronic switch 43 can be an npn-type bipolar junction transistor or other suitable switch having similar functions.

The switch unit 47 can comprise a buffer U1, a switch chip U2 and a jumper J1. The buffer U1 can comprise a detection pin SENSE, a delay pin CT, an input pin $\overline{MR}$, a power supply pin VDD, an output pin $\overline{RESET}$, and a ground pin GND. The switch chip U2 can comprise an enable pin $\overline{OE1}$, an input pin A, a ground pin GND, a power supply pin VCC, and an output pin Y. The jumper J1 can comprise a pin 3, a pin 4, and a pin 5. The detection pin SENSE of the buffer U1 is electrically coupled to a power supply V. The delay pin CT of the buffer U1 is electrically coupled to the ground through a capacitor C. The input pin $\overline{MR}$ of the buffer U1 is electrically coupled to the pin 1 of the connector 41. The power supply pin VDD of the buffer U1 is electrically coupled to the power supply V. The output pin $\overline{RESET}$ of the buffer U1 is electrically coupled to the input pin A of the switch chip U2. The ground pin GND of the buffer U1 is electrically coupled to the ground. The enable pin $\overline{OE1}$ of the switch chip U2 is electrically coupled to the pin 4 of the jumper J1. The output pin Y of the switch chip U2 is electrically coupled to the power-on pin 50. The ground pin GND of the switch chip U2 is electrically coupled to the ground. The power supply pin VCC of the switch chip U2 is electrically coupled to the power supply V. The power-on pin 50 is electrically coupled to the ground through a resistor R3. The pin 3 of the jumper J1 is electrically coupled to the power supply V through a resistor R4, and the pin 5 of the jumper J1 is electrically coupled to the ground. An initial state of the jumper J1 can be that the pin 4 is electrically coupled to the pin 5.

The indicating unit 49 can comprise a buffer U3, at least two light-emitting diodes LED1 and LEDN, and at least two resistors R5 and RN. The buffer U3 can comprise at least two enable pins $\overline{OE2}$ and $\overline{OE3}$, at least two input pins A1 and AN, at least two output pins Y1 and YN, a power supply pin VCC, and a ground pin GND. The enable pins $\overline{OE2}$ and $\overline{OE3}$ of the buffer U3 are electrically coupled to the second terminal of the electronic switch 43. The input pins A1 and AN of the buffer U3 are electrically coupled to the control unit 45 through a resistor R7. The output pin Y1 of the buffer U3 is electrically coupled to a cathode of the light-emitting diode LED1, and an anode of the light-emitting diode LED1 is electrically coupled to the power supply V through the resistor R5. The output pin YN of the buffer U3 is electrically coupled to a cathode of the light-emitting diode LEDN, and an anode of the light-emitting diode LEDN is electrically coupled to the power supply V through the resistor RN. The power supply pin VCC of the buffer U3 is electrically coupled to the power supply V, and the ground pin GND of the buffer U3 is electrically coupled to the ground. In at least one embodiment, the light-emitting diode LED1 can be a power indicator, and the light-emitting diode LEDN can be a debugging indicator. In other embodiments, the light-emitting diode LED1 and LEDN can be other indicators having different functions.

In at least one embodiment, the control unit 45 can comprise an Integrated Baseboard Management Controller (IBMC) 453. The input pins A1 and AN of the buffer U3 are electrically coupled to the IBMC 453.

In at least one embodiment, in event that the power-on pin 50 of the server 100 receives a high level signal, such as logic 1, the server 100 is powered off. In event that the power-on pin 50 of the server 100 receives a low level signal, such as logic 0, the server 100 is powered on.

When the server 100 needs to be repaired, the cover 13 of the server 100 is detached from the base 11, and the first terminal 21 of the switch 20 is disconnected from the second terminal 23 of the switch 20. The pin 1 of the connector 41 outputs a high level signal to the first terminal of the electronic switch 43 and the input pin $\overline{MR}$ of the buffer U1. The output pin $\overline{RESET}$ of the buffer U1 outputs the high level signal to the input pin A of the switch chip U2 after a time delay of the buffer U1. The capacitance C electrically coupled to the delay pin CT can determine how long the buffer U1 is delayed. The pin 4 of the jumper J1 outputs a low level signal to the enable pin $\overline{OE1}$ of the switch chip U2, and the switch chip U2 operates. The output pin Y of the switch chip U2 outputs the high level signal received from the input pin A of the switch chip U2 to the power-on pin 50, the server 100 is powered off, and the server 100 can be repaired.

When the cover 13 is detached from the base 11 and the server 100 does not need to be powered off, the pin 3 of the jumper J1 is electrically coupled to the pin 4 of the jumper J1. The pin 4 of the jumper J1 outputs a high level signal to the enable pin $\overline{OE1}$ of the switch chip U2, and the switch chip U2 does not operate. The power-on pin 50 receives a low level signal, and the server 100 maintains a powered on state.

The first terminal of the electronic switch 43 receives the high level signal output by the pin 1 of the connector 41, and the electronic switch 43 is turned on. Each of the enable pins $\overline{OE2}$ and $\overline{O3}$ receives a low level signal from the second terminal of the electronic switch 43, and the buffer U3 operates. The IBMC 453 outputs a power signal to the input pin A of the buffer U3, the output pin Y1 of the buffer U3 outputs the power signal to the light-emitting diode LED1, and the light-emitting diode LED1 is lit. The IBMC 453 outputs a debug signal to the input pin AN of the buffer U3, the output pin YN of the buffer U3 outputs the debug signal to the light-emitting diode LEDN, and the light-emitting diode LEDN is lit.

After the server 100 is repaired, the cover 13 covers the base 11. The first terminal 21 of the switch 20 is electrically coupled to the second terminal 23 of the switch 20 through the third terminal 25 of the switch 20. The pin 1 of the connector 41 is electrically coupled to the ground through the switch 20. The pin 1 of the connector 41 outputs a low level signal to the first terminal of the electronic switch 43 and the input pin $\overline{MR}$ of the buffer U1. The output pin $\overline{RESET}$ of the buffer U1 outputs the low level signal to the input pin A of the switch chip U2 after a time delay of the buffer U1. The capacitance C electrically coupled to the delay pin CT can determine how long the buffer U1 is delayed. The pin 4 of the jumper J1 outputs a low level signal to the enable pin $\overline{OE1}$ of the switch chip U2, and the switch chip U2 operates. The output pin Y of the switch chip U2 outputs the low level signal received from the input pin A of the switch chip U2 to the power-on pin 50, the server 100 is powered on.

The first terminal of the electronic switch 43 receives the low level signal output by the pin 1 of the connector 41, and the electronic switch 43 is turned off. Each of the enable pins $\overline{OE2}$ and $\overline{OE3}$ receives the high level signal output by the second terminal of the electronic switch 43, the buffer U3 does not operate. The light-emitting diode LED 1 and LEDN electrically coupled to the buffer U3 are not lit.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A server comprising:
   a chassis comprising a base and a cover detachably covering the base;
   a switch mounted on the chassis; and
   a motherboard received in the base and comprising:
   a control circuit comprising a switch unit; and
   a power-on pin,
   wherein the switch unit comprises a first buffer, a switch chip and a jumper, the first buffer is electrically coupled to the switch, and the switch chip is electrically coupled to the first buffer, the jumper, and the power-on pin;
   wherein in event that the cover is detached from the base, the switch outputs a first signal to the first buffer, the jumper outputs a second signal to the switch chip, the switch chip operates, the first buffer outputs the first signal to the switch chip, the switch chip outputs the first signal to the power-on pin, and the server is powered off;
   wherein in event that the base is covered by the cover, the switch outputs a third signal to the first buffer, the jumper outputs the second signal to the switch chip, the switch chip operates, the first buffer outputs the third signal to the switch chip, the switch chip outputs the third signal to the power-on pin, and the server is powered on.

2. The server of claim 1, wherein the control circuit further comprises a connector, the connector comprises a first pin and a second pin, the switch comprises a first terminal, a second terminal, and a third terminal, the first pin of the connector is electrically coupled to the first terminal of the switch and the first buffer, and electrically coupled to a power supply through a first resistor, and the second pin of the connector is electrically coupled to the second terminal of the switch, and electrically coupled to a ground.

3. The server of claim 2, wherein the first terminal and the second terminal of the switch are mounted on the base of the chassis, the third terminal of the switch is mounted on the cover, when the cover is detached from the base, the first terminal of the switch is disconnected with the second terminal of the switch, the first pin of the connector outputs the first signal to the first buffer; when the base is covered by the cover, the first terminal of the switch is electrically coupled to the second terminal of the switch through the third terminal of the switch, the first pin of the connector outputs the third signal to the first buffer.

4. The server of claim 2, wherein the first buffer comprises a delay pin, a first input pin, and a first output pin, the first input pin is electrically coupled to the first pin of the connector to receive the first signal and the third signal, and the first output pin outputs the first signal and the third signal to the switch chip after a time delay of the first buffer.

5. The server of claim 4, wherein the switch chip comprises an enable pin, a second input pin and a second output pin, the second input pin of the switch chip is electrically coupled to the first output pin of the first buffer, and the second output pin of the switch chip is electrically coupled to the power-on pin, and electrically coupled to the ground through a second resistor.

6. The server of claim 5, wherein the jumper comprises a first pin, a second pin, and a third pin, the first pin of the jumper is electrically coupled to the power supply through a third resistor, the second pin of the jumper is electrically coupled to the enable pin of the switch chip, and the third pin of the jumper is electrically coupled to the ground;

wherein in event that the second pin of the jumper is electrically coupled to the third pin of the jumper, the second pin of the jumper outputs the second signal to the enable pin of the switch chip, and the switch chip operates, in event that the cover is detached from the base, the second output pin of the switch chip outputs the first signal to the power-on pin, and the server is powered off; and in the event that the base is covered by the cover, the second output pin of the switch chip outputs the third signal to the power-on pin, and the server is powered on;

wherein in the event that the second pin of the jumper is electrically coupled to the first pin of the jumper, the second pin of the jumper outputs a fourth signal to the enable pin of the switch chip, the switch chip does not operate, and the power-on pin receives the third signal.

7. The server of claim 1, wherein the control circuit further comprises an electronic switch, a control unit, and an indicating unit, the indicating unit is electrically coupled to the electronic switch and the control unit, when the electronic switch receives the first signal, the electronic switch is turned on, the indicating unit is lit; when the electronic switch receives the third signal, the electronic switch is turned off, the indicating unit is not lit.

8. The server of claim 7, wherein the electronic switch comprises a first terminal, a second terminal, and a third terminal, the first terminal of the electronic switch is electrically coupled to the first pin of the connector, the second terminal of the electronic switch is electrically coupled to the indicating unit, and electrically coupled to the power supply through a fourth resistor.

9. The server of claim 7, wherein the electronic switch can be an n-channel metal-oxide semiconductor field-effect transistor (NMOSFET), the first terminal, the second terminal and the third terminal of the electronic switch correspond to a gate, a drain, and a source of the n-channel metal-oxide semiconductor field-effect transistor.

10. The server of claim 8, wherein the indicating unit comprises a second buffer and at least one light-emitting diode, the second buffer comprises a enable pin, a third input pin and a third output pin, the enable pin of the second buffer is electrically coupled to the second terminal of the electronic switch, the third input of the second buffer is electrically coupled to the control unit, the third output pin of the second buffer is electrically coupled to a cathode of the light-emitting diode, an anode of the light-emitting diode is electrically coupled to the power supply through a fifth resistor, when the cover is detached from the base, the electronic switch is turned on, the enable pin of the second buffer receives the first signal, the second buffer operates, the control unit outputs a first control signal to the second buffer, the light-emitting diode is lit; and when the base is covered by the cover, the electronic switch is turned off, the enable pin of the second buffer receives the third signal, the second buffer does not operate, the light-emitting diode is not lit.

* * * * *